(12) United States Patent
Kwon et al.

(10) Patent No.: US 9,099,566 B2
(45) Date of Patent: Aug. 4, 2015

(54) SEMICONDUCTOR DEVICE AND METHOD OF MANUFACTURING THE SAME

(71) Applicant: SK hynix Inc., Icheon-si (KR)

(72) Inventors: Oh Chul Kwon, Seongnam-si (KR); Ki Hong Lee, Suwon-si (KR); Seung Ho Pyi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/735,713

(22) Filed: Jan. 7, 2013

(65) Prior Publication Data

US 2014/0061776 A1    Mar. 6, 2014

(30) Foreign Application Priority Data

Aug. 31, 2012    (KR) .................. 10-2012-0096454

(51) Int. Cl.
*H01L 29/792* (2006.01)
*H01L 21/8239* (2006.01)
*H01L 29/78* (2006.01)
*H01L 27/115* (2006.01)

(52) U.S. Cl.
CPC ...... *H01L 21/8239* (2013.01); *H01L 27/11529* (2013.01); *H01L 27/11548* (2013.01); *H01L 27/11551* (2013.01); *H01L 27/11556* (2013.01); *H01L 27/11573* (2013.01); *H01L 27/11575* (2013.01); *H01L 27/11578* (2013.01); *H01L 27/11582* (2013.01); *H01L 29/7827* (2013.01)

(58) Field of Classification Search
CPC ................... H01L 27/11582; H01L 27/11578; H01L 27/11556; H01L 27/11551; H01L 27/1157; H01L 27/11529; H01L 29/742; H01L 29/7926; H01L 27/11573; H01L 27/11575; H01L 27/11548
USPC .............. 257/324, 326, 315, E29.3, E29.309, 257/E21.423
See application file for complete search history.

(56) References Cited

U.S. PATENT DOCUMENTS

| | | | |
|---|---|---|---|
| 2010/0072538 A1* | 3/2010 | Kito et al. ....................... | 257/326 |
| 2011/0108907 A1 | 5/2011 | Maeda | |
| 2011/0198687 A1* | 8/2011 | Lee ............................... | 257/326 |
| 2011/0284943 A1* | 11/2011 | Hwang et al. .................. | 257/314 |
| 2012/0193705 A1* | 8/2012 | Lim et al. ....................... | 257/330 |
| 2013/0017629 A1* | 1/2013 | Pyo et al. ......................... | 438/16 |

FOREIGN PATENT DOCUMENTS

KR    1020110104317 A    9/2011

* cited by examiner

*Primary Examiner* — Fernando L Toledo
*Assistant Examiner* — Aaron Gray
(74) *Attorney, Agent, or Firm* — Kilpatrick Townsend & Stockton LLP

(57) ABSTRACT

A semiconductor device includes a trench formed in a substrate, a first stacked structure formed in the trench and including a plurality of first material layers and a plurality of second material layers stacked alternately on top of each other, and a transistor located on the substrate at a height corresponding to a top surface of the first stacked structure.

20 Claims, 13 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2012-0096454 filed on Aug. 31, 2012, in the Korean Intellectual Property Office, the entire disclosure of which is incorporated by reference herein.

BACKGROUND

1. Technical Field

Various embodiments relate generally to a semiconductor device and a method of manufacturing the same and, more particularly, to a semiconductor device including a stacked structure and a method of manufacturing the same.

2. Related Art

A non-volatile memory retains data stored therein even when not powered. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

In a 3D non-volatile memory device, since memory cells are stacked over a substrate, a stacked structure with a high aspect ratio is formed. However, such high aspect ratio stacked structure may tilt to one side during the process of manufacturing a semiconductor device. In addition, when a stacked structure is formed in a certain region, a level difference between that region and another region without the stacked structure may be increased. For example, when a stacked structure is formed in a cell region, a level difference between the cell region and a peripheral region may be increased. The increased level difference may lead to an undesirable increase in height of contact plugs formed in the peripheral region. As a result, the difficulties associated with the manufacturing process and the likelihood of failures may be increased.

BRIEF SUMMARY

An embodiment of the present invention relates to a semiconductor device appropriate for preventing a stacked structure from tilting to one side, and a method of manufacturing the same.

A semiconductor device according to an embodiment of the present invention may include a first stacked structure formed in a trench. The first stacked structure may include at least one first material layer and at least one second material layer stacked alternately. The semiconductor device further includes a transistor located on the substrate at a height corresponding to a top surface of the first stacked structure.

A semiconductor device according to another embodiment of the present invention may include: a trench formed in a substrate in a cell region; a first stacked structure including at least one first conductive layer and at least one first interlayer insulating layer alternately stacked in the trench, wherein a first contact region is defined on a top surface of the first stacked structure where the at least one first conductive layer is exposed; a second stacked structure including at least one second conductive layer and at least one second interlayer insulating layer alternately stacked over the first stacked structure, wherein a second contact region is defined along a stepped sidewall of the second stacked structure where the at least one second conductive layer is exposed; and a semiconductor pillar extending through the first and second stacked structures.

A method of manufacturing a semiconductor device according to yet another embodiment of the present invention may include forming a trench in a substrate, forming a first stacked structure in the trench, the first stacked structure including at least one first material layer and at least one second material layer stacked alternately, and forming a transistor on the substrate at a height corresponding to a top surface of the first stacked structure.

DETAILED DESCRIPTION

Figure 1A:
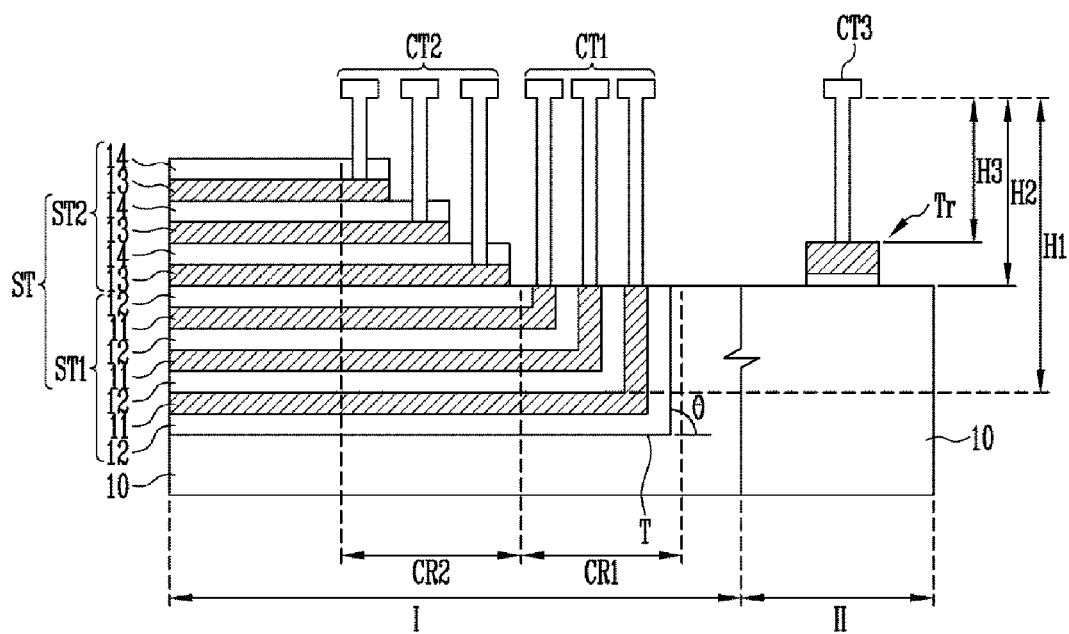
FIGS. 1A to 1C are cross-sectional views of a semiconductor device according to a first embodiment of the present invention.

Hereinafter, various embodiments of the present invention will be described with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

It should be readily understood that the meaning of "on" and "over" in the present disclosure should be interpreted in the broadest manner such that "on" not only means "directly on" something but also includes the meaning of "on" something with an intermediate feature or a layer therebetween, and that "over" not only means the meaning of "over" something but may also include the meaning it is "over" something with no intermediate feature or layer therebetween (i.e., directly on something).

Figure 1B:
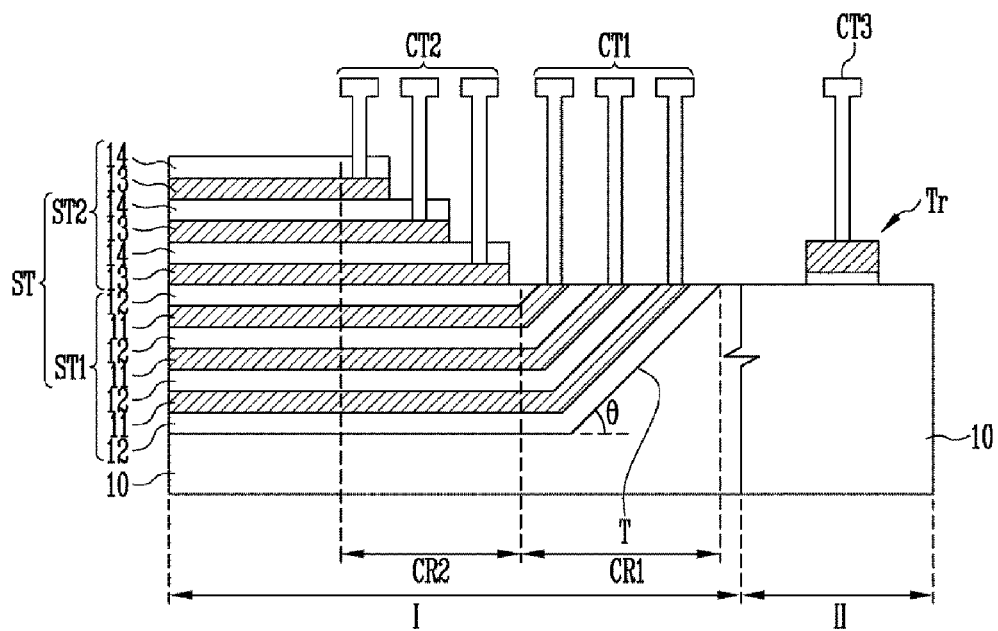
Figure 1C:
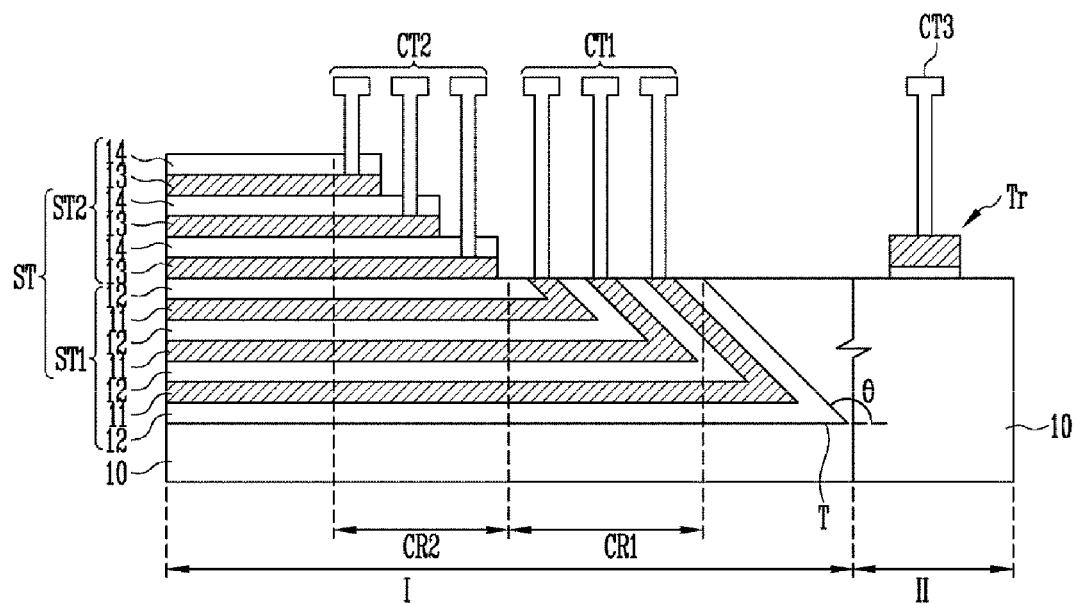

FIGS. 1A to 1C are cross-sectional views of a semiconductor device according to a first embodiment of the present invention.

As illustrated in FIGS. 1A to 1C, the semiconductor device according to the first embodiment of the present invention includes a substrate 10 having a trench T formed therein, a first stacked structure ST1 formed in the trench T and a transistor Tr formed on the substrate 10 at a height corresponding to a top surface of the first stacked structure ST1. In addition, the semiconductor device may further include a second stacked structure ST2 formed on the first stacked structure ST1. In this case, the first stacked structure ST1 and the second stacked structure ST2 together form a single stacked structure ST.

The stacked structure ST is located in a first region I, and the transistor Tr is located in a second region II. For example, the first region I may be a cell region where memory cells configured to store data are located, and the second region II may be a peripheral region where transistors configured to provide access to the memory cells are located.

The first stacked structure ST1 includes one or more first material layers 11 and one or more second material layers 12 that are alternately stacked. The second stacked structure ST2 includes one or more third material layers 13 and one or more fourth material layers 14. Each of the first and third material layers 11 and 13 may comprise a conductive layer such as a polysilicon layer or a tungsten layer, or a semiconductor layer. Each of the first and third material layers 11 and 13 may be configured as a word line, a selection line or a channel layer. In addition, each of the second and fourth material layers 12 and 14 may comprise an insulating layer such as an oxide layer.

The first material layers 11 and the second material layers 12 of the first stacked structure ST1 are alternately stacked in the trench T. In one embodiment, the top surface of the first stacked structure ST1 is at substantially the same height as a surface of the substrate 1, and each of the first and second material layers 11 and 12 has a lateral portion and a vertical end portion that extends along the sidewall of the trench T. A first contact region CR1 is correspondingly defined on the top surface of the first stacked structure ST1 along which the first and second material layers 11 and 12 are exposed.

A sidewall of the second stacked structure ST2 is patterned stepwise, and the third material layers 13 are exposed along the stepped sidewall thereof. Thus, a second contact region CR2 is defined along the stepped sidewall of the second stacked structure ST2.

The trench T may be formed by etching the substrate 10. The trench T may have various shapes. For example, the trench T of various shapes may be formed by controlling etch conditions including types of gas, gas flow, pressure, temperature and etch processes. FIG. 1A illustrates that the trench T has the sidewall with an angle of inclination of 90 degrees ($\theta = 90°$). FIGS. 1B and 1C illustrate that the sidewall of trench T is inclined at different angles. As illustrated in FIG. 1B, when the angle of inclination of the sidewall of the trench T is less than 90° ($\theta < 90°$), areas of the first material layers 11 exposed in the first contact region CR1 are increased. Therefore, a contact margin may be increased when first contact plugs CT1 are formed. Alternatively, as illustrated in FIG. 1C, the sidewall of the trench T may have an angle of inclination greater than 90° ($\theta > 90°$).

In addition, the semiconductor device may further include first contact plugs CT1, second contact plugs CT2 and a third contact plug CT3. Each of the first contact plugs CT1 is coupled to a corresponding one of the first material layers 11 in the first contact region CR1. Each of the second contact plugs CT2 is coupled to a corresponding one of the third material layers 13 in the second contact region CR2. The third contact plug CT3 is coupled to a gate electrode of the transistor Tr. For reference, though not illustrated in FIGS. 1A to 1C, the semiconductor device may further include contact plugs that are coupled to junctions of the transistor Tr.

According to the first embodiment as described above, since the first stacked structure ST1 is formed in the trench T, a height of each first contact plug CT1 may be reduced. Conventionally, since the stacked structure ST is formed over the substrate 10, the third contact plug CT3 is to be formed at a first height H1 corresponding to a bottom surface of the stacked structure ST. However, according to the first embodiment, the transistor Tr is formed at the height corresponding to the top surface of the first stacked structure ST1, that is, the transistor Tr is formed on the surface of the substrate 10, so that a height H3 of the third contact plug CT3 may be reduced. Therefore, the difficulties associated with a contact hole etch process of forming the third contact plug CT3 may be reduced.

In addition, since the first stacked structure ST1 is formed in the trench T, the stacked structure ST may be prevented from tilting to one side. In particular, because a portion of the stacked structure ST is formed inside the trench T of the substrate 10, the stacked structure ST is supported by the substrate 10 and thus does not tilt to one side. In other words, according to the first embodiment, tilting of the stacked structure ST may be prevented without reducing the actual height of the stacked structure ST.

Further, the height of each first contact plug CT1 may be reduced. Conventionally, since the entire stacked structure ST is formed over the substrate 10, the first contact plugs CT1 have the first height H1, i.e., the maximum height. However, according to the first embodiment, since the first contact region CR1 is defined on the top surface of the first stacked structure ST1, the first contact plugs CT1 may have the second height H2. Therefore, the difficulties associated with a contact hole etch process for forming the first contact plugs CT1 may be reduced.

FIGS. 2A to 2F are cross-sectional views illustrating the process flow of a method of manufacturing the semiconductor device according to the first embodiment of the present invention.

Figure 2A:
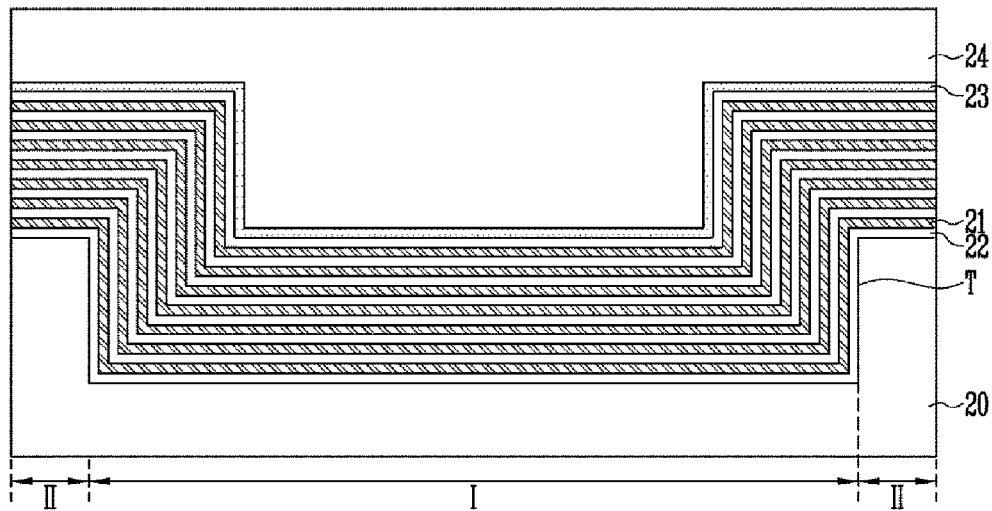
FIGS. 2A to 2F are cross-sectional views illustrating a process flow for forming the semiconductor device according to the first embodiment of the present invention.

As illustrated in FIG. 2A, a substrate 20 is etched to form a trench T in a first region I. The trench T may have various cross sections such as rectangular, trapezoidal and inverted trapezoidal sections.

One or more first material layers 21 and one or more second material layers 22 are alternately formed on the entire surface of the substrate 20 having the trench T formed therein. The first and second material layers 21 and 22 extend along sidewalls and a bottom surface of the trench T and on the top surface of the substrate 20.

Each of the first material layers 21 may be configured as a word line, a selection line or a channel layer. The second material layers 22 may separate the first material layers 21 from each other. Each of the first and second material layers 21 and 22 may be formed of a material with a high etch selectivity.

For example, the first material layer 21 may comprise a conductive layer such as a polysilicon layer, and the second material layer 22 may comprise an insulating layer such as an oxide layer. In another example, the first material layer 21 may comprise a conductive layer such as a doped polysilicon layer or a doped amorphous silicon layer, and the second material layer may comprise a sacrificial layer such as an undoped polysilicon layer or an undoped amorphous silicon layer. In yet another example, the first material layer 21 may comprise a sacrificial layer such as a nitride layer, and the second material layer 22 may comprise an insulating layer such as an oxide layer. Alternatively, the first material layer 21 may comprise a semiconductor layer, and the second material layer 22 may comprise an insulating layer such as an oxide layer.

In this embodiment, a description will be provided with reference to an example in which the first material layer 21 comprises a sacrificial layer and the second material layer 22 comprises an insulating layer.

An etch stop layer 23 is formed over the alternately-stacked first and second material layers 21 and 22. A sacrificial layer 24 is formed on the etch stop layer 23. The etch stop layer 23 may comprise a nitride layer, and the sacrificial layer 24 may comprise an insulating layer such as an oxide layer. In addition, the sacrificial layer 24 is formed with a sufficient thickness so that a stepped surface of an intermediate resultant structure formed by the trench is planarized.

Figure 2B:
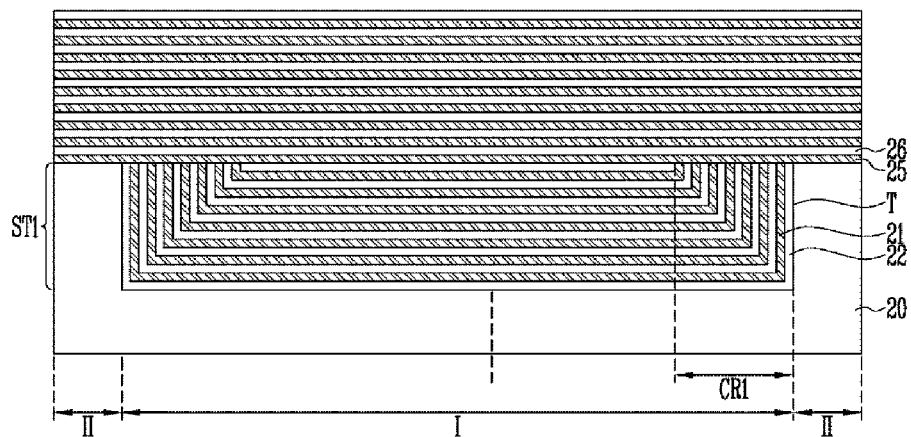

As illustrated in FIG. 2B, a planarization process is performed until the top surface of the substrate 20 is exposed. For example, a planarization process may be performed by using Chemical Mechanical Polishing (CMP). As a result, the first stacked structure ST1 is located in the substrate 20, and the top surface of the stacked structure ST1 is positioned at substantially the same height as the top surface of the substrate 20. The first contact region CR1 is defined on the top surface of the first stacked structure ST1 where first and second material layers 21 and 22 vertically extend upwardly. For example, the first contact region CR1 may be defined at one or both sides of the first stacked structure ST1.

Subsequently, one or more third material layers 25 and one or more fourth material layers 26 are alternately stacked over the substrate 20 in which the first stacked structure ST1 is formed. The third material layers 25 may comprise of substantially the same material as the first material layers 21. In addition, the fourth material layers 26 may comprise of substantially the same material as the second material layers 22.

Figure 2C:
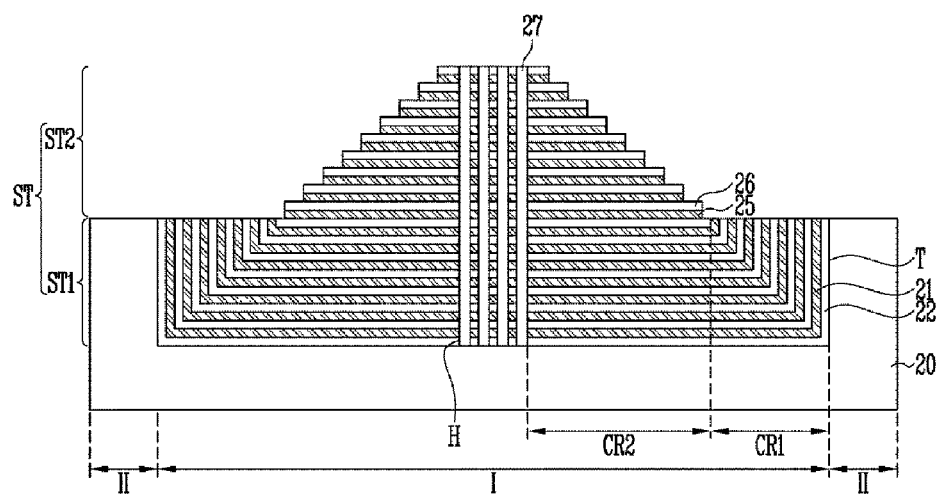

As illustrated in FIG. 2C, the first to fourth material layers 21, 22, 25 and 26 are etched to form holes H. Pillars 27 may be formed in the holes H. Each of the pillars 27 may be a vertical channel layer or a vertical electrode layer. For example, the vertical channel layer may comprise a semiconductor layer, and the vertical electrode layer may comprise a conductive layer. For reference, though not illustrated in FIG. 2C, one or more layers of material with insulating properties and/or charge storage capability may be further formed along an inner wall of each hole H before the pillars 27 are formed.

The third and fourth material layers 25 and 26 are patterned stepwise to form the second stacked structure ST2. The second contact region CR2 extends along the stepped sidewall of the second stacked structure ST2. The second contact region CR2 may extend along one or both sidewalls of the second stacked structure ST2.

For example, the second stacked structure ST2 may be patterned stepwise by performing a slimming process. After a mask pattern (not illustrated) is formed over the third and fourth material layers 25 and 26 in FIG. 2B, a primary etch process is performed so that a first pair of the third and fourth material layers 25 and 26 are etched by using the mask pattern as an etch barrier. After the size of the mask pattern is reduced, a secondary etch process is performed so that a second pair of the third and fourth material layers 25 and 26 are etched using the reduced mask pattern. At the same time, the first pair of the third and fourth material layers 25 and 26 having been etched during the primary etch process are also etched. By repeating the process of reducing the size of the mask pattern and performing the secondary etch process as described above, the second stacked structure ST2 with stepped sidewalls is formed.

In this manner, the stacked structure ST is formed to have the first stacked structure ST1 formed in the substrate 20 and the second stacked structure ST2 formed over the first stacked structure ST1.

For reference, a description has been made in reference to a case in which the slimming process is performed after the pillars 27 are formed. However, the pillars 27 may be formed after the slimming process is performed. Alternatively, the process of forming the pillars 27 may be omitted.

Figure 2D:
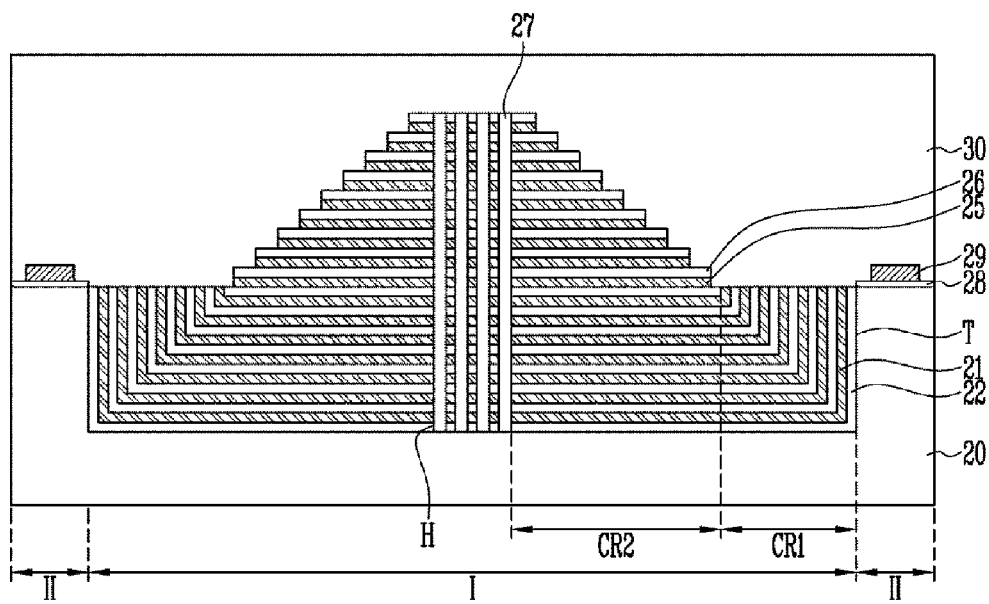

As illustrated in FIG. 2D, transistors are formed in the second region II of the substrate 20. For example, after a gate insulating layer 28 is formed in the second region II of the substrate 20, a conductive layer may be formed on the gate insulating layer 28. Subsequently, the conductive layer may be etched to form gate electrodes 29. The process steps for forming other elements of the transistors (such as source and drain regions in the case of MOS transistors) are well known in this art and thus will not be described.

An insulating layer 30 is formed over a resultant structure having the transistors. The insulating layer 30 has a sufficient thickness to completely cover the stacked structure ST. For example, the insulating layer 30 may comprise an oxide layer that is formed by a High Density Plasma (HDP) process.

Figure 2E:
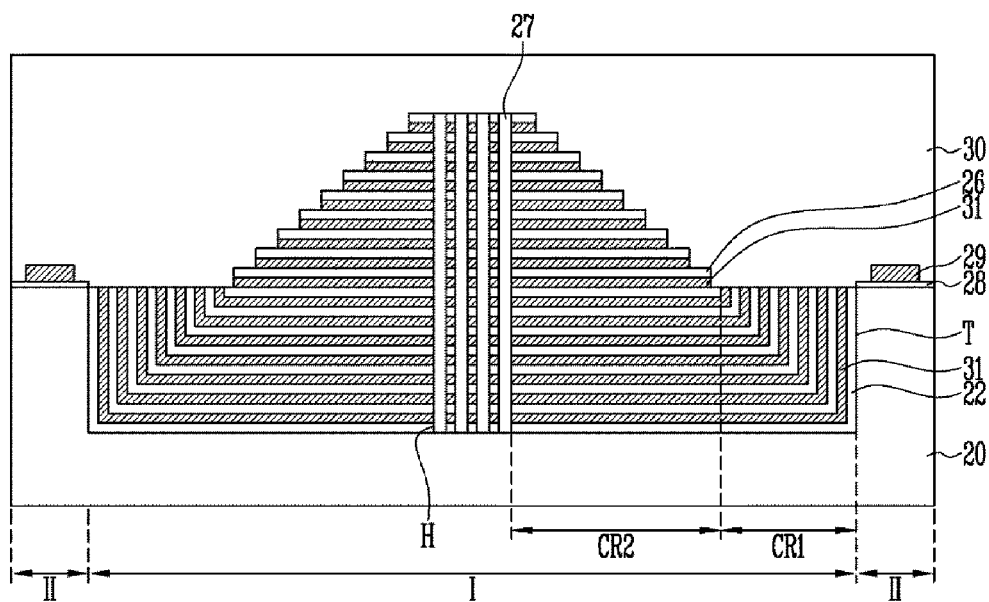

As illustrated in FIG. 2E, the first and third material layers 21 and 25 are replaced by first conductive layers 31. For example, the insulating layer 30 and the first to fourth material layers 21, 22, 25 and 26 may be etched to form one or more slits (not illustrated). The slits may be deep enough to expose the first and third material layers 21 and 25. Subsequently, the first and third material layers 21 and 25 exposed through the slits may be etched to form first recessed regions. The first conductive layers 31 may then be formed in the first recessed regions. Subsequently, insulating layers (not illustrated) may be formed in the slits. Here, air gaps may be formed in the slits by controlling deposition method and thickness of the insulating layers.

In an alternate embodiment, the first and third material layers 21 and 25 may be replaced by first semiconductor layers.

Figure 2F:
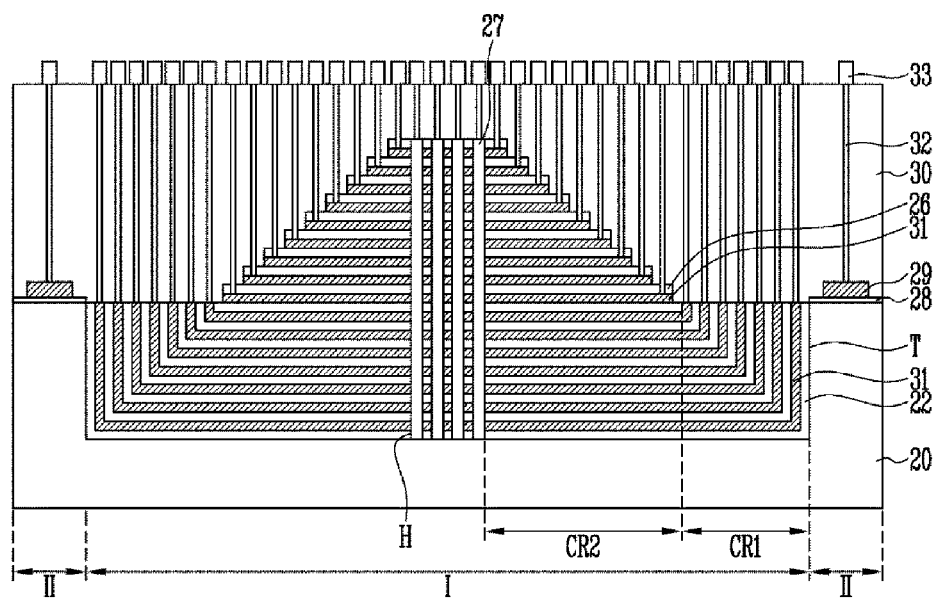

As illustrated in FIG. 2F, the insulating layer 30 may be etched to form contact holes, through which the first conductive layers 31 and the gate electrodes 29 of the transistors are exposed. Second conductive layers 32 are formed in the contact holes, thereby forming contact plugs. For example, the contact plugs may include first contact plugs coupled to the first conductive layers 31 of the first stacked structure ST1, second contact plugs coupled to the first conductive layers 31 of the second stacked structure ST2 and third contact plugs coupled to the gate electrodes 29 of the transistors.

After a third conductive layer 33 is formed on the insulating layer 30 in which the contact plugs 32 are formed, the third conductive layer 33 is patterned to form wires. The wires may be bit lines, selection lines or metal interconnections.

Additionally, various changes may be made to the above-described manufacturing processes, particularly to the process subsequent to the formation of the slits, depending on materials of the first to fourth material layers 21, 22, 25 and 26.

For example, when the first and third material layers 21 and 25 comprise conductive layers, and the second and fourth material layers 22 and 26 comprise interlayer insulating layers, the first and third material layers 21 and 25 exposed through the slits may be silicided after the slits are formed. Subsequently, insulating layers may be formed in the slits.

In another example, when the first and third material layers 21 and 25 comprise conductive layers, and the second and fourth material layers 22 and 26 comprise sacrificial layers, the second and fourth material layers 22 and 26 exposed through the slits may be removed to form second recessed regions. Subsequently, the first and third material layers 21 and 25 exposed through the slits may be silicided, and insulating layers may be formed in the second recessed regions and the slits.

Figure 3A:
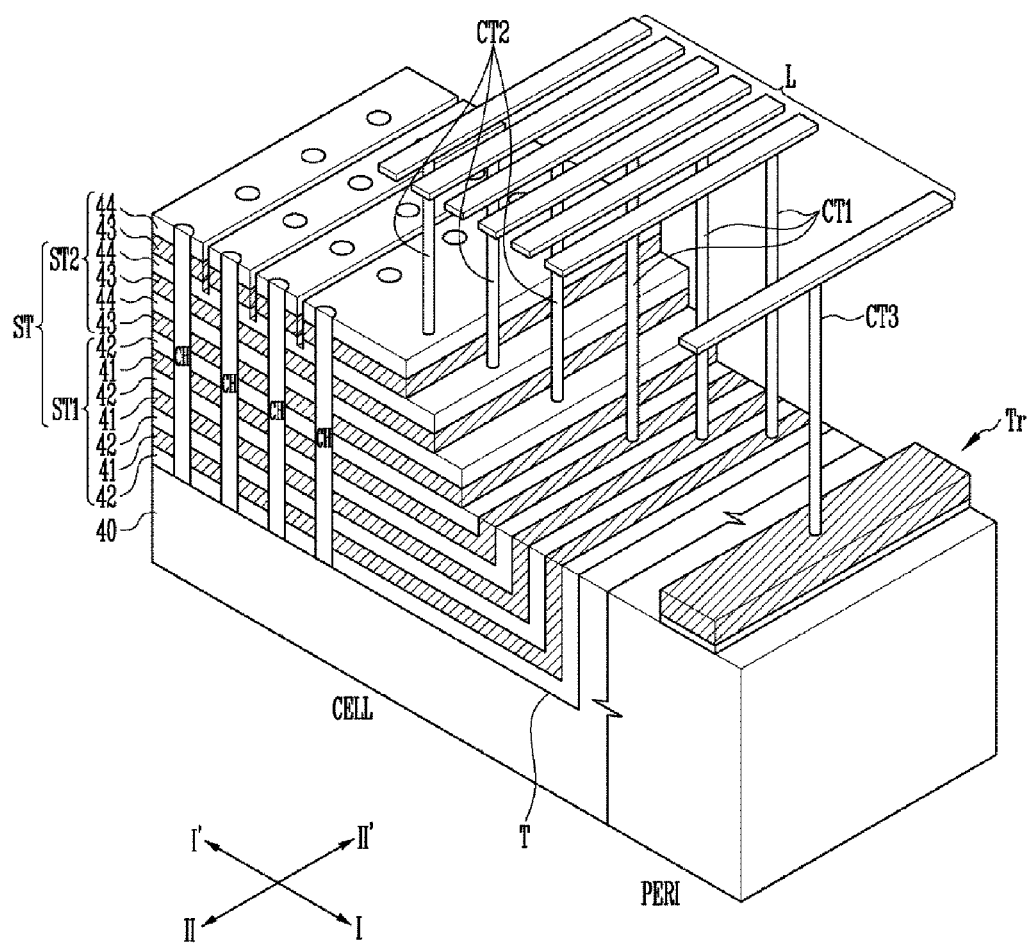
FIG. 3A is a perspective view of a structure of a semiconductor device according to a second embodiment of the present invention.

FIG. 3A is a perspective view of a structure of a semiconductor device according to a second embodiment of the present invention.

As shown in FIG. 3A, the semiconductor device according to the second embodiment includes a stacked structure ST formed in a cell region CELL, vertical channel layers CH extending through the stacked structure ST, and a transistor Tr formed in a peripheral region PERI.

The stacked structure ST includes a first stacked structure ST1 formed in a substrate 40 and a second stacked structure ST2 formed over the first stacked structure ST1. In addition, the first stacked structure ST1 may include one or more first conductive layers 41 and one or more first interlayer insulating layers 42 that are alternately stacked. The second stacked structure ST2 includes one or more second conductive layers 43 and one or more second interlayer insulating layers 44 that are alternately stacked.

The lowermost first conductive layer 41 may be a lower selection gate, the uppermost second conductive layer 43 may be an upper selection gate, and the other first and second conductive layers 41 and 43 may be word lines. According to this structure, each memory string may include at least one lower selection transistor, a plurality of memory cells and at least one upper selection transistor. The semiconductor device includes a plurality of such memory strings extending in a vertical direction, with each memory string being associated with one of the vertical channel layers CH.

Vertical channel layers CH extend through the stacked structure ST, and may be disposed along a first direction I-I' and along a second direction II-II' perpendicular to the first direction I-I', as shown in FIG. 3A. Each of the vertical channel layers CH may comprise silicon material, and may form the channel region for the select transistors and the memory cells associated with the channel layer CH. As further shown in FIG. 3A, insulation-filled shallow trenches extend between each pair of vertical channel layers CH, and vertically penetrate through the upper most second interlayer insulating layer 44 and the upper most second conductive layer 43. These shallow trenches serve to isolate the upper most select transistors associated with neighboring memory strings.

In addition, the semiconductor device may further include first contact plugs CT1, second contact plugs CT2 and a third contact plug CT3. Each of the first contact plugs CT1 is coupled to a corresponding one of the first conductive layers 41. Each of the second contact plugs CT2 is coupled to a corresponding one of the second conductive layers 43. The third contact plug CT3 is coupled to a gate electrode of the transistor Tr. In addition, the semiconductor device may further include conductive wires L that are coupled to the first to third contact plugs CT1 to CT3, respectively.

The semiconductor device according to the second embodiment may be manufactured according to the manufacturing method described above with reference to FIGS. 2A to 2F.

Figure 3B:
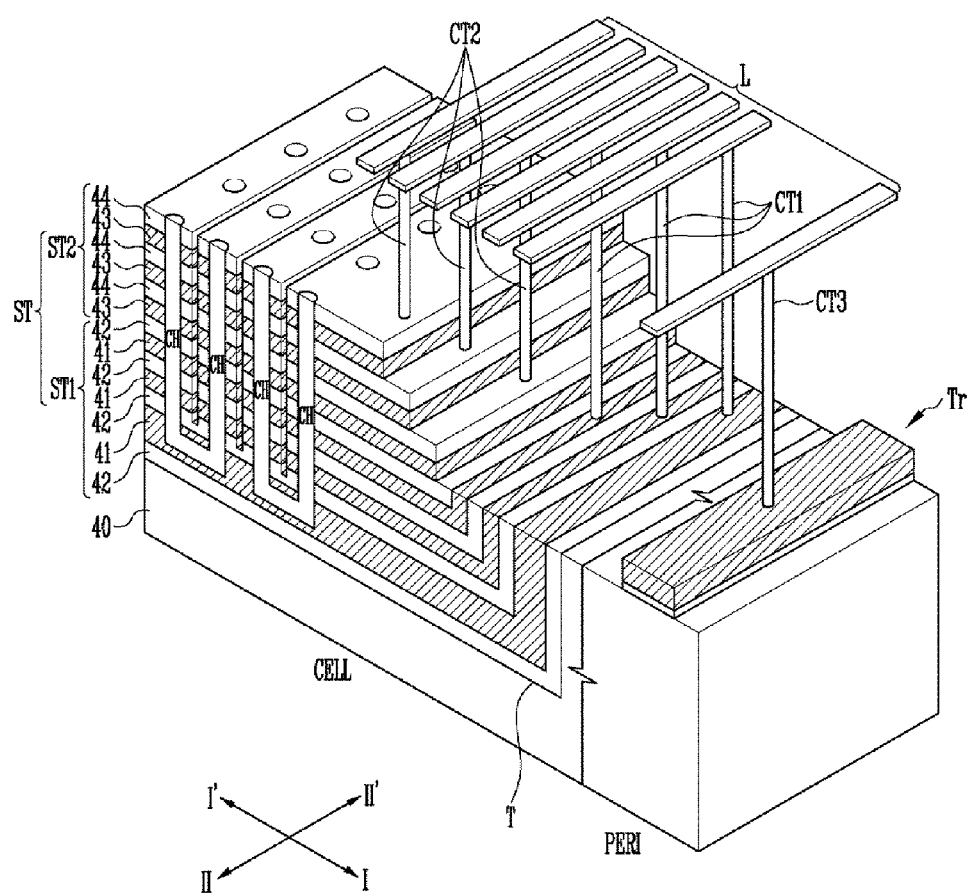
FIG. 3B is a perspective view of a structure of a semiconductor device according to a third embodiment of the present invention.

FIG. 3B is a perspective view of a structure of a semiconductor device according to a third embodiment of the present invention.

As illustrated in FIG. 3B, the semiconductor device according to the third embodiment includes a stacked structure ST formed in a cell region CELL, channel layers CH having a U-shape, and a transistor Tr formed in a peripheral region PERI.

The stacked structure ST includes a first stacked structure ST1 formed in a substrate 40 and a second stacked structure ST2 formed over the first stacked structure ST1. In addition, the first stacked structure ST1 includes one or more first conductive layers 41 and one or more first interlayer insulating layers 42 that are stacked alternately. The second stacked structure ST2 includes one or more second conductive layers 43 and one or more second interlayer insulating layers 44 that are stacked alternately.

Each channel layer CH includes at least one pair of vertical channel layers extending through the stacked structure ST and a laterally extending pipe channel layer coupling neighboring vertical channel layers. In addition, the channel layers CH extend through the stacked structure ST, and may be disposed along a first direction I-I' and along a second direction II-II' perpendicular to the first direction I-I', as shown in FIG. 3B.

The lowermost first conductive layer 41 may be a pipe gate, which surrounds the pipe channel layer. The uppermost second conductive layer 43 may be a drain or source selection gate. The other first and second conductive layers 41 and 43 may be word lines. The lowermost first conductive layer 41 may have a greater thickness than the other first and second conductive layers 41 and 43 so that the lowermost first conductive layer 41 may completely surround the pipe channel layer, i.e., top, bottom as well as laterally extending sides thereof. As shown in FIG. 3B, an insulation-filled trench is formed between the vertical legs of each U-shaped channel layer CH. These insulation-filled trenches vertically extend through the first and second interlayer insulating layers 42 and 44 and the first and second conductive layers 41 and 43, and terminate before reaching the lower-most first conductive layer 41. According to this structure, each memory string includes at least one drain selection transistor, a plurality of memory cells and at least one source selection transistor. The semiconductor device, thus, includes a plurality of U-shaped memory strings.

In addition, the semiconductor device may further include first contact plugs CT1, second contact plugs CT2 and a third contact plug CT3. Each of the first contact plugs CT1 is coupled to a corresponding one of the first conductive layers 41. Each of the second contact plugs CT2 is coupled to a corresponding one of the second conductive layers 43. The third contact plug CT3 is coupled to a gate electrode of the transistor Tr. In addition, the semiconductor device may further include conductive wires L that are coupled to the first to third contact plugs CT1 to CT3, respectively.

The semiconductor device according to the third embodiment may be manufactured by applying the manufacturing method described above with reference to FIGS. 2A to 2F.

First, the substrate 40 is etched to form a first trench T. The lower-most second material layer 42 and the lower-most first material layer 41 are formed on an entire surface of the substrate 40 having the trench formed therein. After the lower-most first material layer 41 is etched to form second trenches, the second trenches are filled with sacrificial layers (not illustrated). The subsequent first and second material layers 41 and 42 are alternately formed in substantially the same manner as the processes described above in connection with FIGS. 2A to 2C. Next, vertical channel holes are formed so that the channel holes reach the second trenches. More specifically, the vertical channel holes extend through the first and second material layers 41 and 42 and reach the second trenches so that the sacrificial layers in the second trenches become exposed. The exposed sacrificial layers in the second trenches are removed, and then channel layers CH are formed in the second trenches and the vertical channel holes. The process for forming the transistor Tr is substantially the same as that described above in connection with FIGS. 2D and 2E.

FIGS. 4A to 4E are cross-sectional views of various cell structures that can be integrated with the semiconductor devices according to the second and third embodiments of the present invention.

Figure 4A:
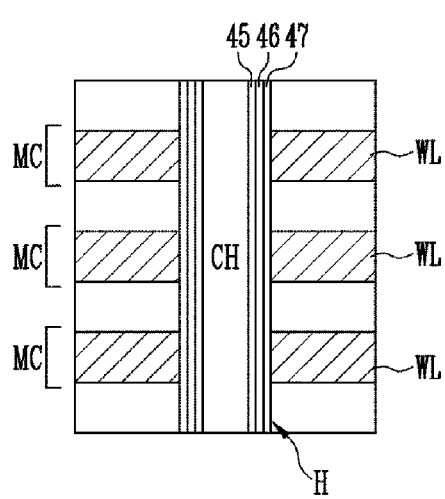
FIGS. 4A to 4E are cross-sectional views of cell structures that can be integrated with the semiconductor devices according to the second and third embodiments of the present invention.

As illustrated in FIG. 4A, memory cells MC include a vertical channel layer CH, a tunnel insulating layer 45 surrounding the vertical channel layer CH, a charge storing layer 46 surrounding the tunnel insulating layer 45 and a charge blocking layer 47 surrounding the charge storing layer 46. The charge storing layer 46 may include a polysilicon layer that can store and emit charge, a nitride layer that can trap and emit charge, and/or nanodots.

A method of manufacturing the memory cells MC in FIG. 4A is described in brief. First, the first to fourth material layers 21, 22, 25 and 26 are etched to form a hole H. The charge blocking layer 47, the charge storing layer 46 and the tunnel insulating layer 45 are formed along the inner surfaces of the hole H. The charge blocking layer 47, the charge storing layer 46 and the tunnel insulating layer 45 along the bottom of the hole H are etched, so that the substrate 40 is exposed along the bottom of the hole H. Subsequently, the vertical channel layer CH is formed in the hole H.

In an alternate embodiment, a protective layer (not illustrated) may be additionally formed on the vertically-extending portions of tunnel insulating layer 45 before removing layers 45, 46 and 47 from the bottom of the hole H. The protective layer may prevent the tunnel insulating layer 45 from being damaged when the charge blocking layer 47, the charge storing layer 46 and the tunnel insulating layer 45 along the bottom of the hole H are etched. FIG. 4A illustrates that the hole H is completely filled with the vertical channel layer CH. However, the vertical channel layer CH may have a tubular shape having an open central portion. In this case, the open central portion may be filled with an insulating layer. In the embodiment with U-shaped channel layers CH (FIG. 3B), the charge blocking layer 47, the charge storing layer 46 and the tunnel insulating layer 45 formed along inner surfaces of the vertical channel holes and the lateral pipe holes may be left intact prior to forming the channel layer CH in the vertical channel holes and the pipe channel holes.

Figure 4B:
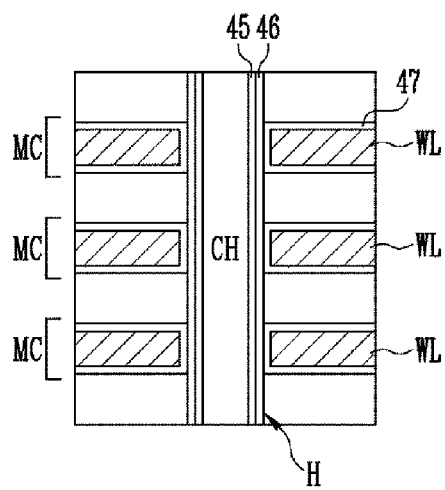

As illustrated in FIG. 4B, the memory cells MC include the vertical channel layer CH, the tunnel insulating layer 45 surrounding the vertical channel layer CH, the charge storing layer 46 surrounding the tunnel insulating layer 45 and charge blocking layers 47. The charge blocking layers 47 are interposed between the charge storing layer 46 and word lines WL and surround top and bottom surfaces of the word lines WL.

A method of manufacturing the memory cells MC in FIG. 4B is described in brief. After the first to fourth material layers 21, 22, 25 and 26 are etched to form the hole H, the charge storing layer 46 and the tunnel insulating layer 45 are formed along the inner surfaces of the hole H. Subsequently, the vertical channel layer CH is formed on the tunnel insulating layer 45. The first to fourth material layers 21, 22, 25 and 26 are etched to form at least one slit. The first and third material layers 21 and 25 exposed through the slit are etched to form first recessed regions. Subsequently, the charge blocking layers 47 are formed along inner surfaces of the first recessed regions, and the word lines WL are formed in the first recessed regions by filling conductive layers in the first recessed regions in which the charge blocking layers 47 are formed.

In an alternate embodiment, before the vertical channel layer CH is formed, a first charge blocking layer (not illustrated), the charge storing layer 46 and the tunnel insulating layer 45 may be formed along the inner surfaces of the hole H, and a second charge blocking layer 47 may be formed along inner surfaces of the first recessed region before the word lines WL are formed. In this case, the first charge blocking layer exposed through the first recessed regions may be removed before the second charge blocking layers 47 are formed.

Figure 4C:
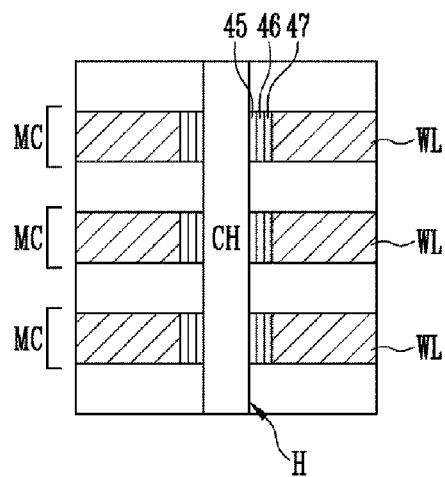

As illustrated in FIG. 4C, the memory cells MC include the vertical channel layer CH, tunnel insulating layers 45 intermittently surrounding the vertical channel layer CH, charge storing layers 46 intermittently surrounding the tunnel insulating layers 45 and the charge blocking layers 47 intermittently surrounding the charge storing layers 46. Here, the tunnel insulating layers 45, the charge storing layers 46 and the charge blocking layers 47 are interposed between the vertical channel layer CH and the word lines WL. As a result, the charge storing layers 46 of the stacked memory cells MC are physically separated from each other, thereby preventing movement of charges between the memory cells MC.

A method of manufacturing the memory cells MC in FIG. 4C is described in brief. The first to fourth material layers 21, 22, 25 and 26 are etched to form the hole H. The charge blocking layer 47, the charge storing layer 46 and the tunnel insulating layer 45 are formed along the inner surfaces of the hole H. Subsequently, the charge blocking layer 47, the charge storing layer 46 and the tunnel insulating layer 45 along the bottom of the hole H are etched to expose the substrate 40 on the bottom surface of the hole H. The vertical channel layer CH is then formed in the hole H. The first to fourth material layers 21, 22, 25 and 26 are etched to form at least one slit. The second and forth material layers 22 and 26 exposed through the slit are etched to form second recessed regions. Subsequently the charge blocking layer 47, the charge storing layer 46 and the tunnel insulating layer 45 exposed through the second recessed regions are etched, and insulating layers are formed in the second recessed regions.

Figure 4D:
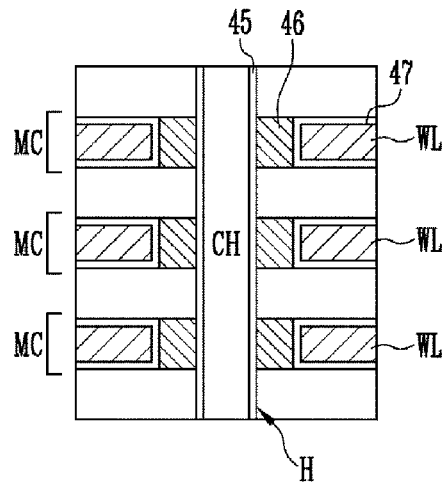

As illustrated in FIG. 4D, the memory cells MC include the vertical channel layer CH, the tunnel insulating layer 45 surrounding the vertical channel layer CH, the charge storing layers 46, and the charge blocking layers 47. The charge storing layers 46 intermittently surround the tunnel insulating layer 45 and are interposed between the tunnel insulating layer 45 and the word lines WL. The charge blocking layers 47 are interposed between the charge storing layer 46 and the word line WL and surround top and bottom surfaces of the word lines WL. Therefore, the charge storing layers 46 of the stacked memory cells MC are physically separated from each other, thereby preventing a movement of charges between the memory cells MC.

A method of manufacturing the memory cells MC in FIG. 4D is described in brief. The first to fourth material layers 21, 22, 25 and 26 are etched to form the hole H. The first and third material layers 21 and 25 exposed along the inner surfaces of the hole H are etched to form third recessed regions. The charge storing layers 46 are formed in the third recessed regions. After the tunnel insulating layer 45 is formed along the inner surfaces of the hole H, the vertical channel layer CH is formed. The first to fourth material layers 21, 22, 25 and 26 are etched to form slits, and the first and third material layers 21 and 25 exposed through the slits are etched to form the second recessed regions. The charge blocking layers 47 are formed along inner surfaces of the second recessed regions.

The word lines WL are formed in the second recessed regions. As a result, the charge storing layers 46 of the stacked memory cells MC are physically separated from each other, thereby preventing movement of charges between the memory cells MC.

Figure 4E:
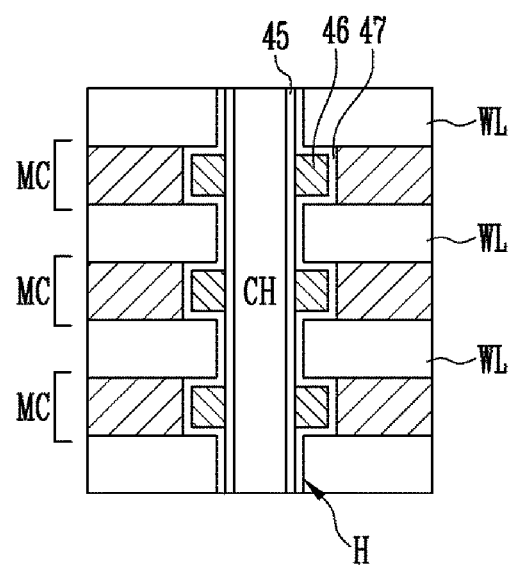

As illustrated in FIG. 4E, the memory cells MC include the vertical channel layer CH, the tunnel insulating layer 45 surrounding the vertical channel layer CH, the charge storing layers 46 and the charge blocking layer 47. The charge storing layers 46 intermittently surround the tunnel insulating layer 45 and are interposed between the tunnel insulating layer 45 and the word lines WL. The charge blocking layer 47 surrounds the charge storing layer 46 and the tunnel insulating layer 45. Therefore, the charge storing layers 46 of the stacked memory cells MC are physically separated from each other, thereby preventing a movement of charges between the memory cells MC.

A method of manufacturing the memory cells MC in FIG. 4E is described in brief. The first to fourth material layers 21, 22, 25 and 26 are etched to form the hole H. The first and third material layers 21 and 25 exposed along the inner surfaces of the hole H are etched to form the third recessed regions. Subsequently, the charge blocking layer 47 is formed along the inner surfaces of the hole H and the third recessed regions. The charge storing layers 46 are formed in the third recessed regions over the charge blocking layer 47. After the tunnel insulating layer 45 is formed along the inner surfaces of the hole H, the vertical channel layer CH is formed. Therefore, the charge storing layers 46 of the stacked memory cells MC are physically separated from each other, thereby preventing movement of charges between the memory cells MC.

Figure 5A:
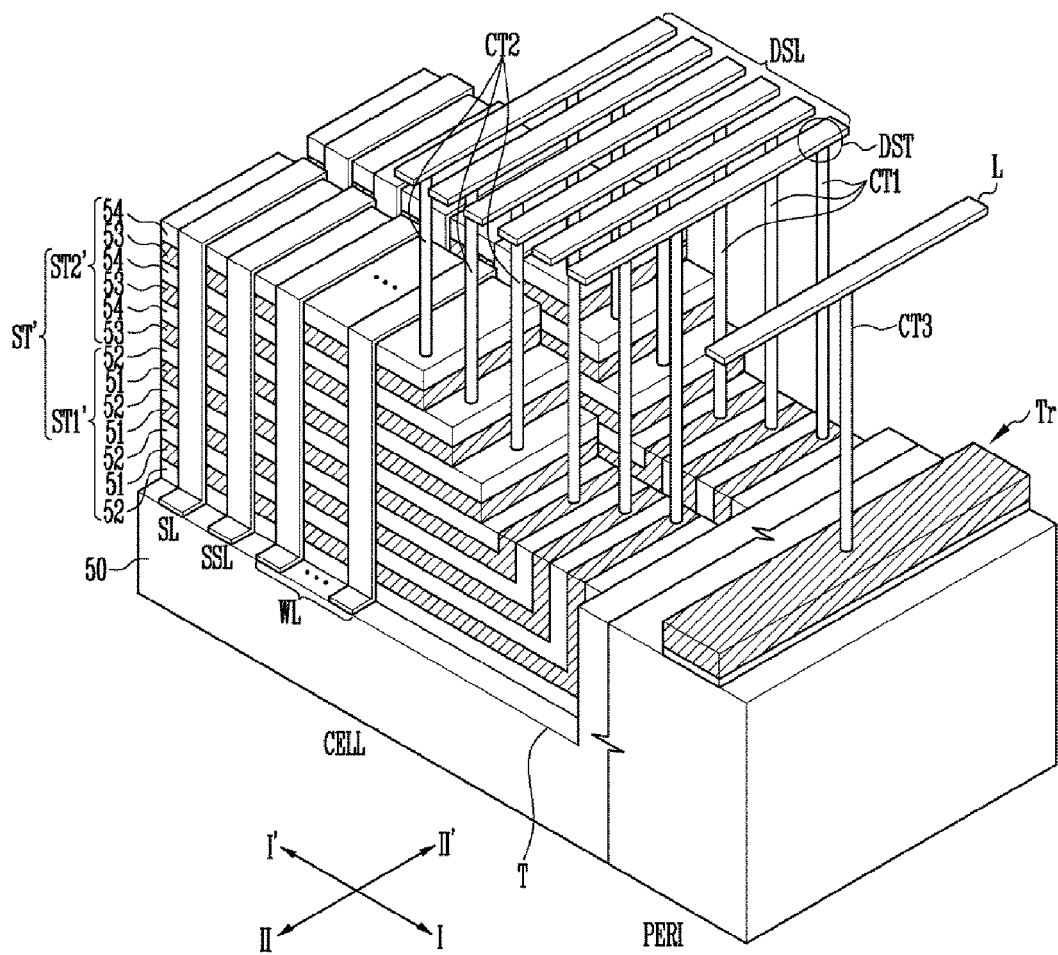
FIGS. 5A and 5B are perspective views of a structure of a semiconductor device according to a fourth embodiment of the present invention.
Figure 5B:
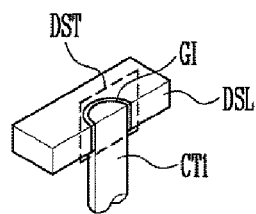

FIGS. 5A and 5B are perspective views of a structure of a semiconductor device according to a fourth embodiment of the present invention.

As illustrated in FIGS. 5A and 5B, the semiconductor device according to the fourth embodiment includes stacked structures ST', one or more conductive lines extending around the stacked structures ST', and a transistor Tr. The stacked structures ST' are located in the cell region CELL and have linear shapes extending in the first direction I-I'. The conductive lines wrap around the sides of the stacked structures ST' and extend in the second direction II-II' crossing the stacked structures ST'. The transistor Tr is formed in the peripheral region PERI.

Each of the stacked structures ST' includes a first stacked structure ST1' formed in a trench T extending into a substrate 50 and a second stacked structure ST2' formed over the first stacked structure ST1'. The first stacked structure ST1' includes one or more first channel layers 51 and one or more first interlayer insulating layers 52 that are alternately stacked. The second stacked structure ST2' includes one or more second channel layers 53 and one or more second interlayer insulating layers 54 that are alternately stacked.

The conductive lines extending around the stacked structure ST' include a source line SL, at least one source selection line SSL and a plurality of word lines WL. Memory layers including one or more layers of material with insulating properties and charge storage capability (not illustrated) are interposed between the stacked structure ST' and each of the source selection line SSL and the word lines WL, while the source line SL makes direct contact with first and second channel layers 51 and 53. In one embodiment, each memory layer includes a charge blocking layer, a charge storing layer and a tunnel insulating layer.

The semiconductor device may further include first contact plugs CT1 each coupled to a corresponding one of the first channel layers 51, second contact plugs CT2 each coupled to a corresponding one of the second channel layers 53, and a third contact plug CT3 coupled to a gate electrode of the transistor Tr.

In addition, the semiconductor device may further include drain selection lines DSL coupled to the first and second contact plugs CT1 and CT2, respectively, and wire L coupled to the third contact plug CT3. The drain selection lines DSL surround the first or second contact plugs CT1 and CT2 and extend in a direction crossing the stacked structures ST'. Therefore, drain selection transistors DST are located at intersections between the drain selection lines DSL and the first and second contact plugs CT1 and CT2. Here, the first or second contact plugs CT1 and CT2 surrounded by the drain selection lines DSL may be channel layers of the drain selection transistors DST. In addition, each drain selection transistor DST includes a gate insulating layer GI surrounding the channel layer and has a gate all-around structure (GAA) in which an entire surface of the channel layer is surrounded by a gate electrode.

According to this structure, each string includes a lower selection transistor, a plurality of memory cells and at least one upper selection transistor. A plurality of strings that are arranged in a horizontal direction are thus stacked.

A method of manufacturing the semiconductor device according to the fourth embodiment is described in brief. As described above with reference to FIGS. 2A to 2C, the stacked structure ST' having the first and second stacked structures ST1' and ST2' are formed. The first and third material layers 51 and 53 comprise semiconductor layers such as a polysilicon layer, and the second and fourth material layers 52 and 54 comprise insulating layers such as an oxide layer.

The first to fourth material layers 51 to 54 are etched and patterned linearly. Memory layers (not illustrated) are formed on entire surfaces of the stacked structures ST' having linear shapes. Each memory layer may include a tunnel insulating layer, a charge storing layer and a charge blocking layer.

After first conductive layers are formed on the memory layers, the first conductive layers and the memory layers are patterned and etched so that the conductive lines extending in the direction crossing the stacked structures ST' along the II-II' direction are formed, and the memory layers are interposed between the conductive lines and the stacked structures ST'.

After the transistor Tr is formed in the peripheral region PERI, an insulating layer (not illustrated) is formed over the entire resultant structure. Subsequently, the first to third contact plugs CT1 to CT3 coupled to the first and second channel layers 51 and 53 and the gate electrode of the transistor Tr, respectively, are formed. For example, the drain selection lines DSL may be formed on the insulating layer, and the drain selection lines DSL and the insulating layer may then be etched to form contact holes through which the first and second channel layers 51 and 53 are exposed. Next, second conductive layers may be formed in the contact holes to form the first and second contact plugs CT1 and CT2. The insulating layer may be etched to form a contact hole through which the gate electrode of the transistor Tr is exposed, and a second conductive layer may then be formed in the contact hole to form the third contact plug CT3. Subsequently, the (conductive) wires L coupled to the third contact plug CT3 are formed.

Figure 6A:
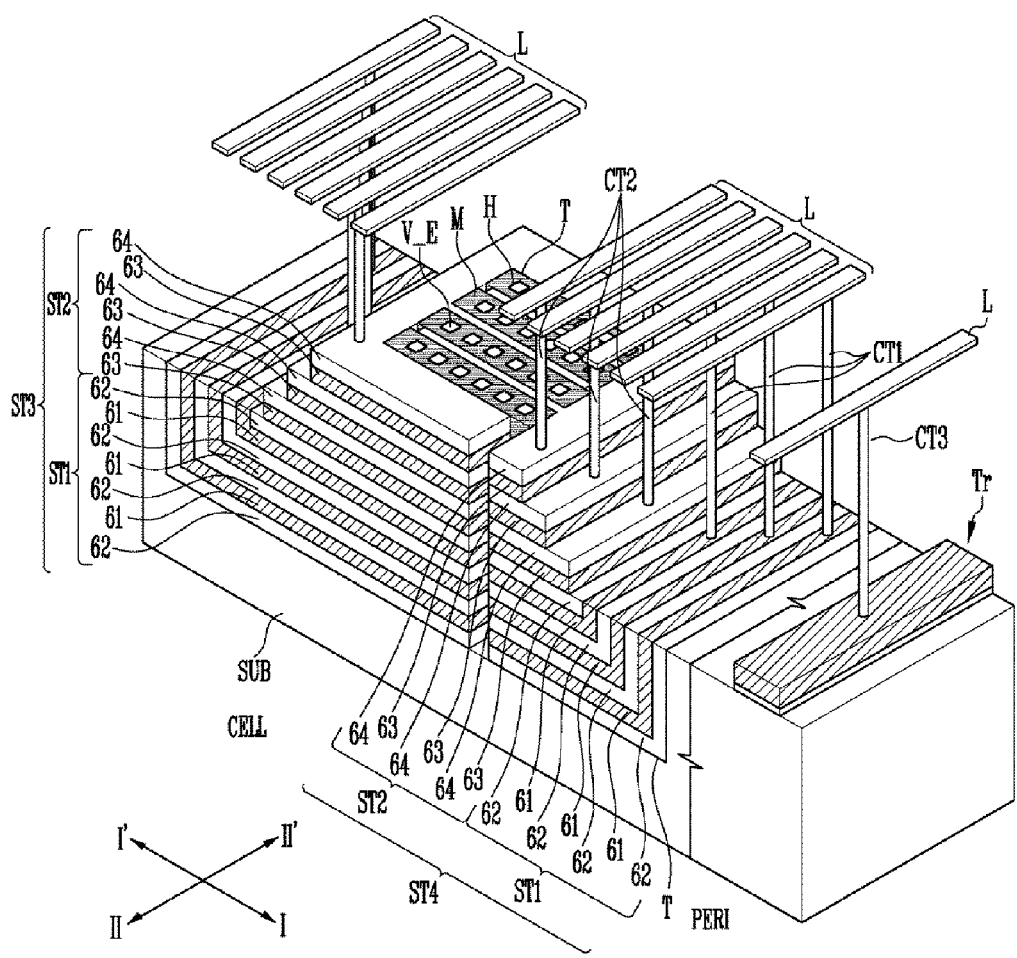
FIGS. 6A to 6C are perspective views of a structure of a semiconductor device according to a fifth embodiment of the present invention.
Figure 6B:
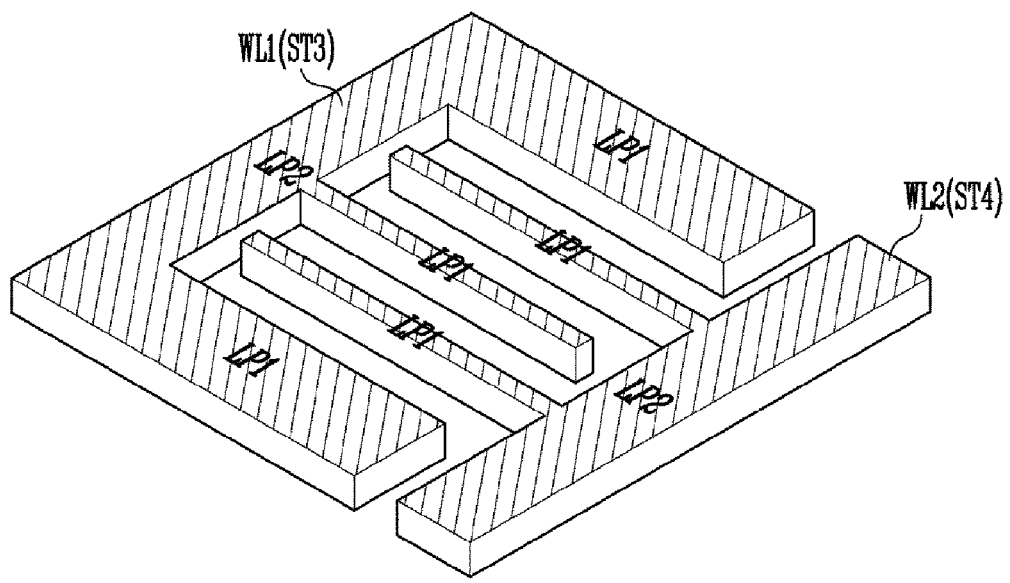
Figure 6C:
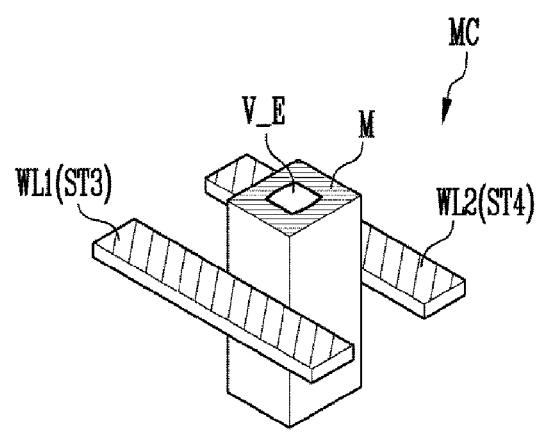

FIGS. 6A to 6C are perspective views of a structure of a semiconductor device according to a fifth embodiment.

As illustrated in FIGS. 6A and 6B, the semiconductor device according to the fifth embodiment includes third and fourth stacked structures ST3 and ST4 formed in the cell region CELL, vertical electrode layers V_E, and a transistor Tr formed in the peripheral region PERI.

Each of the third and fourth stacked structures ST3 and ST4 includes a first stacked structure ST1 formed in a trench T extending into a substrate SUB and a second stacked structure ST2 formed over the first stacked structure ST1. The first stacked structure ST1 includes one or more first conductive layers 61 and one or more first interlayer insulating layers 62. The second stacked structure ST2 includes one or more second conductive layers 63 and one or more second interlayer insulating layers 64. In addition, the vertical electrode layers V_E are arranged in the first direction I-I' and the second direction II-II' perpendicular to the first direction I-I' between the third stacked structure ST3 and the fourth stacked structure ST4.

The third and fourth stacked structures ST3 and ST4 are finger-shaped structures. In addition, each of the third and fourth stacked structures ST3 and ST4 includes first line patterns LP1 and second line patterns LP2. The first line patterns LP1 extend in the first direction I-I'. The second line patterns LP2 couple the first line patterns and extend in the second direction II-II'. In addition, the first line patterns LP1 of the third stacked structure ST3 and the first line patterns LP1 of the fourth stacked structure ST4 are alternately arranged. In addition, the vertical electrode layers V_E are located between the first line patterns LP1 of the third stacked structure ST3 and the first line patterns LP1 of the fourth stacked structure ST4 that are alternately arranged.

The third and fourth stacked structures ST3 and ST4 may further include memory layers M that surround the vertical electrode layers V_E. The memory layers M may be formed of variable resistance materials. For example, the variable resistance materials may include perovskite-based materials, chalcogenide-based materials, oxygen-deficient metal oxides, or metal sulfides. The perovskite-based materials may include SrTiO (STO) or PrCaMnO (PCMO). The chalcogenide-based materials may include GeSbTe (GST), GeSe, CuS, or AgGe. The transition metal oxides may include NiO, $TiO_2$, HfO, $Nb_2O_5$, ZnO, $ZrO_2$, $WO_3$, CoO, or $MnO_2$. The metal sulfides may include $Cu_2S$, CdS, or ZnS.

The semiconductor device may further include first contact plugs CT1 each coupled to a corresponding one of the first conductive layers 61, second contact plugs CT2 each coupled to a corresponding one of the second conductive layers 63 and a third contact plug CT3 coupled to the gate electrode of the transistor Tr. In addition, the semiconductor device may further include wires L coupled to the first to third contact plugs CT1 to CT3, respectively.

As illustrated in FIG. 6C, each memory cell MC includes the vertical electrode V_E, first and second word lines WL1 and WL2 extending in a direction crossing the vertical electrode V_E, and the memory layer M interposed between the vertical electrode V_E and the word lines WL1 and WL2. The vertical electrode V_E is located between the first word line WL1 and the second word line WL2. In addition, the first word line WL1 may be the first or third conductive layer 61 or 63 included in the third stacked structure ST3, and the second word line WL2 may be the first or third conductive layer 61 or 63 included in the fourth stacked structure ST4. According to the above-described structure of the semiconductor device, a desired memory cell can be accessed by selecting one of the first and second word lines WL1 and WL2 on the same layer and selecting the vertical electrode V_E. In addition, the semiconductor device includes a plurality of memory cells stacked along the vertical electrode V_E.

A method of manufacturing the semiconductor device according to the fifth embodiment is described below.

Conductive layers and interlayer insulating layers are alternately formed in the manner described in prior embodiments, and are subsequently etched to form one or more trenches T. After the memory layers M are formed in the trenches T, the memory layers M are etched to form one or more electrode holes H. Subsequently, the electrode holes H are filled with conductive layers to form the vertical electrode layers V_E. The conductive layers and the interlayer insulating layers that are alternately stacked are etched to form the finger shaped third and fourth stacked structures ST3 and ST4.

Figure 7:
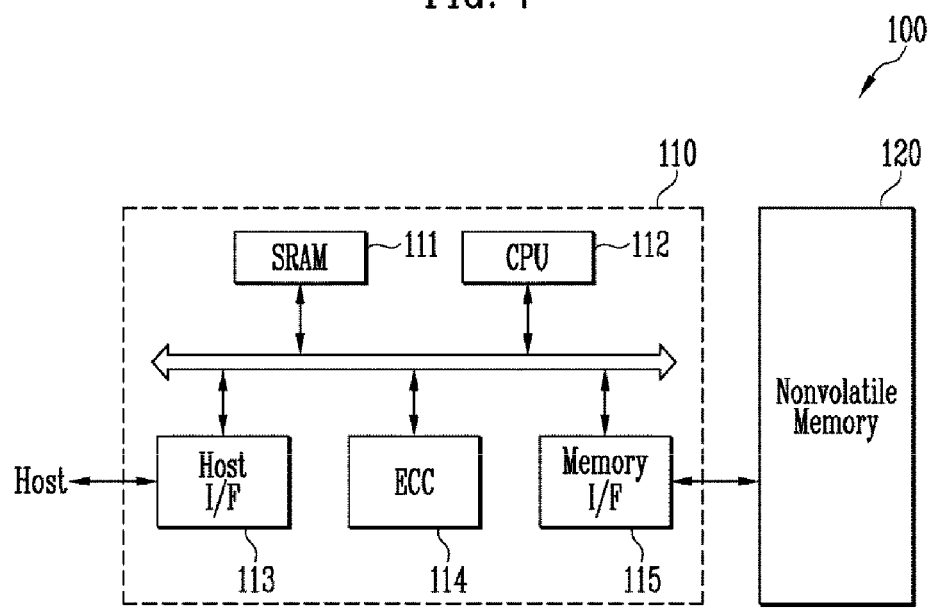
FIG. 7 is a block diagram showing the configuration of a memory system according to an embodiment of the present invention.

FIG. 7 is a block diagram showing the configuration of a memory system according to an embodiment of the present invention.

As illustrated in FIG. 7, a memory system 100 according to an embodiment of the present invention includes a non-volatile memory device 120 and a memory controller 110.

The non-volatile memory device 120 has the stacked structure described above in the first to fifth embodiments. In addition, the non-volatile memory device 120 may be a multi-chip package composed of a plurality of flash memory chips.

The memory controller 110 is configured to control the non-volatile memory device 120. The memory controller 110 may include SRAM 111, a CPU 112, a host interface 113, an ECC 114 and a memory interface 115. The SRAM 111 functions as an operation memory of the CPU 112. The CPU 112 performs the general control operation for data exchange of the memory controller 110. The host interface 113 includes a data exchange protocol of a host being coupled to the memory system 100. In addition, the ECC 114 may detect and correct errors included in a data read from the non-volatile memory device 120. The memory interface 115 interfaces with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 8:
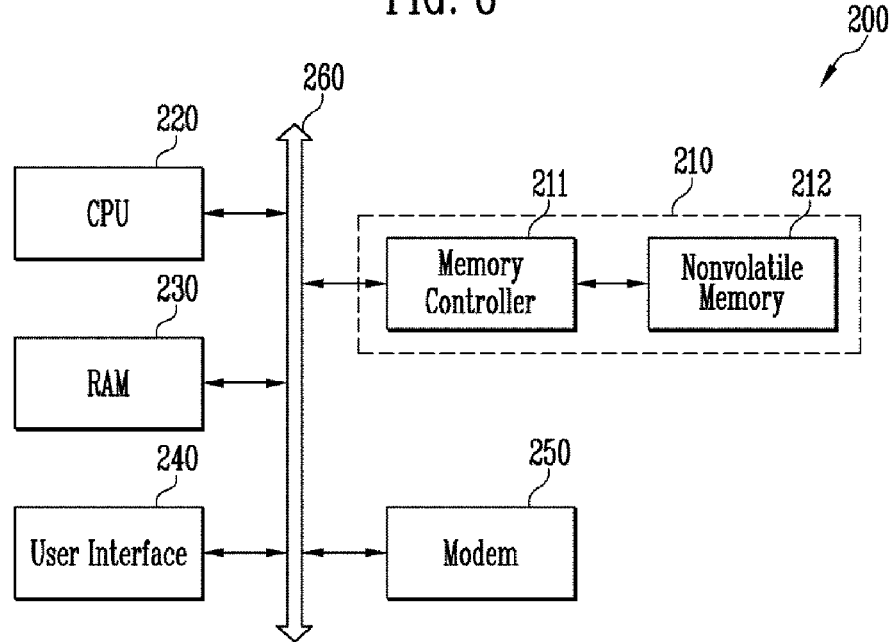
FIG. 8 is a block diagram showing the configuration of a computing system according to an embodiment of the present invention.

FIG. 8 is a block diagram showing the configuration of a computing system according to an embodiment of the present invention.

As illustrated in FIG. 8, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and mobile DRAM.

As described above with reference to FIG. 7, the memory system 210 may include a non-volatile memory 212 and a memory controller 211.

A stacked structure may be prevented from tilting to one side by providing a stacked structure in a trench formed in a substrate. In addition, a height of a contact plug coupled to a gate electrode of a transistor may be reduced by forming the transistor on the substrate at a height corresponding to a top surface of the first stacked structure.

In this specification, various stacked structures have been described with reference to the accompanying drawings. However, they are provided for illustration purposes, and the invention is not limited thereto. For example, while the figures for the various embodiments show the stacked structure (made up of the first and second stacked structures) extending above the height of the trench, in some embodiments the entirely of the stacked structure may be disposed within the trench. Also, while the Figures for the various embodiments show the first material layers (that are inside the trench and extend up through the trench) being contacted by contact plugs at a height substantially equal to the top surface of the substrate where transistor Tr is formed, the invention is not limited as such. For example, the first material layers may be contacted by the contact plugs at a height above or below the top surface of the substrate where transistor Tr is formed. Factors impacting selection of the height at which these contacts are made include the amount of level difference between the cell and peripheral regions that the process technology can tolerate and process complexity. Thus, the present invention can be applied to any semiconductor device having various stacked structures.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A semiconductor device, comprising:
    a trench formed in a substrate;
    a first stacked structure formed in the trench and including a plurality of first material layers and a plurality of second material layers stacked alternately on top of each other, wherein a first contact region is defined on the top surface of the first stacked structure where the plurality of first material layers are exposed in the same level;
    a second stacked structure including a plurality of third material layers and a plurality of fourth material layers alternately stacked on top of each other, wherein the second stacked structure has a stepped sidewall, and a second contact region is defined on the stepped sidewall where the plurality of third material layers are exposed in different levels;
    at least one pillar, each pillar formed as a single conductivity type layer extending through the first and second stacked structures; and
    a transistor located on the substrate at a height corresponding to a top surface of the first stacked structure.

2. The semiconductor device of claim 1, further comprising:
    a plurality of first contact plugs coupled to the plurality of first material layers in the first contact region; and
    a plurality of second contact plugs coupled to the plurality of third material layers in the second contact region.

3. The semiconductor device of claim 1, further comprising a contact plug coupled to a gate electrode of the transistor located at the height corresponding to the top surface of the first stacked structure so that a height of the contact plug is reduced.

4. The semiconductor device of claim 1, wherein the top surface of the first stacked structure is at substantially the same height as a surface of the substrate.

5. The semiconductor device of claim 1, wherein the first material layer comprises a conductive layer, and the second material layer comprises an interlayer insulating layer.

6. The semiconductor device of claim 5, further comprising at least one vertical channel layer extending through the first stacked structure.

7. The semiconductor device of claim 6, further comprising a pipe channel layer coupling bottoms of neighboring vertical channel layers.

8. The semiconductor device of claim 1, wherein the trench has an inclined sidewall.

9. A semiconductor device, comprising:
    a trench formed in a substrate;
    a first stacked structure formed in the trench and including a plurality of first material layers and a plurality of second material layers stacked alternately on top of each other, and having a flat top surface, wherein a first contact region is defined on the top surface of the first stacked structure where the plurality of first material layers are exposed in the same level;
    a second stacked structure including a plurality of third material layers and a plurality of fourth material layers alternately stacked on top of each other, wherein the second stacked structure has a stepped sidewall, and a second contact region is defined on the stepped sidewall where the plurality of third material layers are exposed in different levels; and
    a transistor located on the substrate at a height corresponding to a top surface of the first stacked structure,
    wherein each of the first and third material layers comprises a channel semiconductor layer, and each of the second and fourth material layers comprises an interlayer insulating layer.

10. The semiconductor device of claim 9, further comprising:
    at least one conductive line extending along a sidewall of the first stacked structure in a direction perpendicular to the direction in which the plurality of first and second material layers extend; and
    a memory layer interposed between the at least one conductive line and the first stacked structure.

11. A semiconductor device, comprising:
    a trench formed in a substrate in a cell region;
    a first stacked structure including a plurality of first conductive layers and a plurality of first interlayer insulating layers alternately stacked on top of each other in the trench, wherein a first contact region is defined on a top surface of the first stacked structure where the plurality of first conductive layers are exposed in the same level;
    a second stacked structure including a plurality of second conductive layers and a plurality of second interlayer insulating layers alternately stacked on top of each other and over the first stacked structure, wherein a second contact region is defined along a stepped sidewall of the second stacked structure where the plurality of second conductive layers are exposed in different levels;
    a hole extending through the first and second stacked structures; and
    a semiconductor pillar formed as a single layer in the hole and extending through the first and second stacked structures.

12. The semiconductor device of claim 11, further comprising a transistor located on the substrate outside the trench.

13. The semiconductor device of claim 12, further comprising:
    a plurality of first contact plugs coupled to a respective one of the plurality of first conductive layers in the first contact region;
    a plurality of second contact plugs coupled to a respective one of the second conductive layers in the second contact region; and
    a third contact plug coupled to a gate electrode of the transistor.

14. The semiconductor device of claim 12, wherein the transistor is located at a height corresponding to the top surface of the first stacked structure.

15. The semiconductor device of claim 11, wherein the top surface of the first stacked structure is flat.

16. A semiconductor device, comprising:
- a trench formed in a substrate, the trench having a predetermined depth;
- a stacked structure comprising a plurality of first and second material layers stacked alternately on top of one another, the stacked structure including a first portion extending into the trench, wherein a first contact region is defined on the top surface of the first portion where a plurality of the first material layers are exposed in the same level, and a second portion extending outside the trench wherein a second contact region is defined on a stepped sidewall where a plurality of the first material layers are exposed in different levels;
- at least one pillar, each pillar formed as a single layer and extending through the first and second portions; and
- a transistor located on a top surface of the substrate outside the trench at a first height intermediate the height of the stacked structure.

17. The semiconductor device of claim 16 wherein the plurality of first material layers of the first portion extend up through the trench and are contacted by a respective one of a plurality of first contact plugs at the first contact region with a second height intermediate the height of the stacked structure.

18. The semiconductor device of claim 17 wherein first and second heights are substantially equal.

19. The semiconductor device of claim 17 wherein the second height is substantially equal to the predetermined depth of the trench.

20. The semiconductor device of claim 17 wherein the plurality of first material layers of the second portion are contacted by a respective one of a plurality of second contact plugs at the second contact region.

* * * * *